United States Patent
Hardy

(10) Patent No.: US 12,013,213 B2
(45) Date of Patent: Jun. 18, 2024

(54) VEHICLE DETECTION SYSTEM AND METHODS

(71) Applicant: SharkSense Ltd., Ra'anana (IL)

(72) Inventor: Leor Hardy, Givatayim (IL)

(73) Assignee: SharkSense Ltd., Ra'anana (IL)

( * ) Notice: Subject to any disclaimer, the term of this patent is extended or adjusted under 35 U.S.C. 154(b) by 516 days.

(21) Appl. No.: 17/289,081

(22) PCT Filed: Dec. 4, 2019

(86) PCT No.: PCT/IL2019/051327
§ 371 (c)(1),
(2) Date: Apr. 27, 2021

(87) PCT Pub. No.: WO2020/115745
PCT Pub. Date: Jun. 11, 2020

(65) Prior Publication Data
US 2022/0003525 A1    Jan. 6, 2022

Related U.S. Application Data

(60) Provisional application No. 62/774,893, filed on Dec. 4, 2018.

(30) Foreign Application Priority Data

Sep. 9, 2019 (IL) .......................................... 269217

(51) Int. Cl.
*F41H 11/02* (2006.01)
*G01R 29/08* (2006.01)
*G01S 11/06* (2006.01)

(52) U.S. Cl.
CPC ............. *F41H 11/02* (2013.01); *G01R 29/08* (2013.01); *G01S 11/06* (2013.01)

(58) Field of Classification Search
None
See application file for complete search history.

(56) References Cited

U.S. PATENT DOCUMENTS

| | | | |
|---|---|---|---|
| 7,782,256 B2 * | 8/2010 | Smith | G01S 13/726 342/453 |
| 9,569,959 B1 | 2/2017 | Sprague | |
| 9,715,009 B1 * | 7/2017 | Parker | F41H 11/02 |
| 9,987,981 B1 * | 6/2018 | Deyaf | B60Q 5/006 |
| 2008/0309565 A1 | 12/2008 | Villarroel et al. | |

(Continued)

OTHER PUBLICATIONS

Publication "Radar Signatures" on the website radartutorial.eu; no author given; no date given; retrieved on Sep. 28, 2023. (Year: 2023).*

*Primary Examiner* — Bernarr E Gregory
(74) *Attorney, Agent, or Firm* — NKL Law; Jae Youn Kim

(57) ABSTRACT

A method and a system are provided for detecting manned and unmanned vehicles intruding into a restricted area, including: operating a first vehicle and measuring multiple frequencies of electromagnetic radiation emitted from the first vehicle; determining, from the multiple frequencies of emitted electromagnetic radiation, one or more identifying electromagnetic radiation characteristics; and configuring a radio receiver to detect the one or more identifying electromagnetic radiation characteristics emitted by a second vehicle at a distance of a detection range.

10 Claims, 3 Drawing Sheets

(56) References Cited

U.S. PATENT DOCUMENTS

| | | | |
|---|---|---|---|
| 2011/0267222 A1* | 11/2011 | Craig | G01S 3/04 |
| | | | 342/28 |
| 2015/0350914 A1* | 12/2015 | Baxley | H04W 72/20 |
| | | | 726/11 |
| 2016/0124041 A1 | 5/2016 | Pathak et al. | |
| 2017/0192089 A1 | 7/2017 | Parker et al. | |
| 2018/0129882 A1 | 5/2018 | Seeber et al. | |

* cited by examiner

VEHICLE DETECTION SYSTEM AND METHODS

FIELD OF THE INVENTION

The present invention relates to surveillance systems for monitoring unmanned or manned aerial, land, or sea vehicles and in particular to methods and systems for remote vehicle detection.

BACKGROUND

The use of drones and other small unmanned (UVs) and clusters of such devices to attack domestic targets or to inflict similar acts of aggression or espionage or disruption will increase in the coming years. The ability to warn against an incoming vehicle attack (whether manned or unmanned) will therefore be increasingly important. The desired warning distance may be from at least one kilometer, in all lighting (including arrival from the direction of the sun) in all weather conditions, in smoke, dust and sand storm conditions. These requirements pose serious problems for possible solutions such as optical, thermal, acoustic and even radar detection. (Hereinbelow, the word drone will be used meaning any kind of small unmanned aerial vehicle, or UAV. The term UV refers to drones and other unmanned vehicles including, but not limited to: cars, ships and mobile robots.)

Ideally, several seconds of warning should be provided to defense forces, meaning that detection of an incoming vehicle, particularly a UAV, should be successfully performed at a distance of a kilometer or more. An ideal system should not be affected by the direction of an incoming attack, including arrival from the direction of the sun, and should operate in all weather conditions, including rain, snow, smoke, dust and sand storm conditions.

These requirements pose problems to existing solutions to vehicle detection. Some vehicle detection methods focus on capturing control signals transmitted between a control unit and the vehicle. However, these signals may be obscured by a variety of means.

The US Federal Aviation Administration (FAA) estimated that in 2017 there were three million drones worldwide. Drones may replace many types of ground-based delivery vehicles. However, as drones and other vehicles proliferate, the threats they present will require rapid detection and identification by defense forces.

SUMMARY

Embodiments of the present invention provide methods and systems for detecting unmanned and manned vehicles, typically where the vehicle is entering a restricted area. The method may include: operating a first vehicle and measuring multiple frequencies of electromagnetic radiation emitted from the first vehicle at a test distance; determining, from the multiple frequencies of emitted electromagnetic radiation, one or more identifying electromagnetic radiation characteristics, wherein the one or more identifying characteristics include one or more modulation frequencies of one or more electromagnetic carrier frequencies, or carrier frequencies without modulation; and configuring a radio receiver to detect the one or more identifying electromagnetic radiation characteristics at a distance of a detection range; and, detecting by the electromagnetic receiver, from a distance of the detection range.

In some embodiments, the electromagnetic radiation emitted from the first vehicle may be measured at a test range, and configuring the radio receiver to detect the one or more identifying electromagnetic radiation characteristics at the distance of the detection range includes configured the radio receiver to detect the radiation emitted by the second vehicle at a power level reduced from a power level detected at the test range by a factor proportional to the ratio of the test range to the detection range.

In further embodiments insulation of the closed environment may be employed to reduce electromagnetic radiation in a range of 30 MHz to 1.6 GHz and the multiple frequencies of electromagnetic radiation measured may be in the range of 30 MHz to 1.6 GHz.

The vehicle may be an unmanned aerial vehicle (UAV) and the detection range may be an air space perimeter of a restricted area.

The electromagnetic receiver may include a multi-stage filter including a low-pass filter, a high pass filter, a 30 to 1600 MHz or wider amplifier and an analog-to-digital (A-to-D) converter and processing device.

In further embodiments, detecting the second vehicle may include issuing an electronic or audio security alert following the detection. In further embodiments, detecting the second vehicle may include determining at least one of a speed and a position of the second vehicle. In further embodiments, detecting the second vehicle includes triangulating the position of the vehicle.

Operating the first vehicle may include operating the first vehicle in a closed environment insulated to reduce external electromagnetic radiation.

There is also provided, by embodiments of the present invention, a system for detecting intruding vehicles in a given airspace including: a radio antenna configured to receive electromagnetic radiation; and a defense control unit (DCU) including a radio receiver and a computer processor having associated memory storage including instructions that when executed by the computer processor implement steps of: receiving one or more identifying electromagnetic radiation characteristics of a first vehicle including one or more modulation frequencies of one or more electromagnetic carrier frequencies; detecting the one or more identifying electromagnetic radiation characteristics in electromagnetic radiation received by the radio antenna, wherein the electromagnetic radiation is emitted by a second vehicle at a distance of a detection range; and responsively issuing an alert to a defense system.

BRIEF DESCRIPTION OF DRAWINGS

For a better understanding of various embodiments of the invention and to show how the same may be carried into effect, reference will now be made, by way of example, to the accompanying drawings. Structural details of the invention are shown to provide a fundamental understanding of the invention, the description, taken with the drawings, making apparent to those skilled in the art how the several forms of the invention may be embodied in practice. In the figures.

DETAILED DESCRIPTION

Unmanned vehicles (UVs) as well as manned vehicles (MVs) can be used for armed attacks, disruption of operations, and for espionage. The term "restricted site" is used hereinbelow to refer to any site that may be the target of such attack or espionage and therefore needs a system of advanced warning of approaching UVs and MVs, particularly unmanned aerial vehicles (UAVs). Such restricted sites may include civil infrastructure sites, businesses, residential areas, and agriculture areas, as well as government and military sites.

Figure 1:
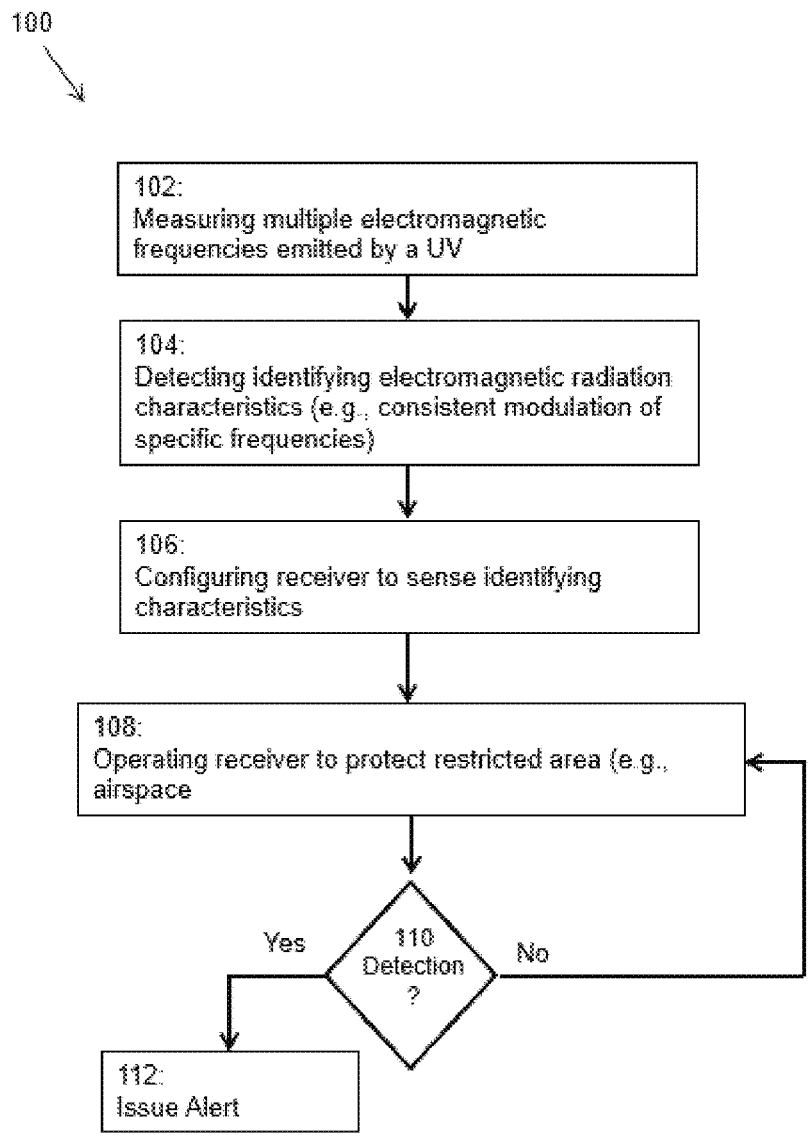
FIG. 1 is a flow diagram, depicting a process of detecting vehicles, according to some embodiments of the present invention.

FIG. 1 is a flow diagram, depicting a process 100 of detecting incoming manned and unmanned vehicles, according to some embodiments of the present invention. Steps of the process 300 are as follows.

At an initialization step 102, a test vehicle, which may be designed for either manned or unmanned operation, may be operated in an anechoic chamber, that is, an electromagnetically insulated chamber that absorbs electromagnetic radiation, thereby reducing reflection waves, while also reducing the presence of external electromagnetic radiation. Electromagnetic radiation at multiple frequencies is measured and recorded. Emissions of electromagnetic radiation may be due to several vehicle sources, such as emissions from device motors and from oscillators used as clocks in processors or as local oscillators (LO) in GPS and other receivers. In one embodiment, key frequencies are determined that are then used to "fingerprint" a given vehicle, that is, to determine identifying electromagnetic radiation characteristics. A spectrograph may be used to scan a range of frequencies emitted by a vehicle, for example in a range of 30 MHz to 1.6 GHz, as well as frequencies that are at known oscillations, such as 1.6 GHz for a GPS receiver. Frequencies that have greater power levels than the background noise are then tested, for example by a machine learning algorithm, to determine if those frequencies include recognizable patterns, such as modulating frequencies or the frequency itself. Determining the fingerprint of a vehicle does not require testing it from a close distance, but the determination of identifying electromagnetic radiation characteristics is simplified when external noise is reduced.

At a second step 104, the multiple measured frequencies are analyzed. For example, as indicated by graph 150 in FIG. 2, signal reception at a specific frequency from one vehicle (a DGI Phantom 4 Pro) was measured as −50 dBm, from a distance of 1 meter. This power is equivalent to −110 dBm from a distance of one kilometer. This level of signal power can be picked up by a superheterodyne or a direct demodulation radio receiver or by processing the raw data from an analog to digital converter. The signal includes a recurring amplitude modulating frequency of 200 KHz, and therefore, although generally considered noise, it can be identified. Identifying characteristics such as cycle time and waveform can differentiate the signal from other signals at similar frequencies.

Oscillators used in a UAV can also be detected. Such radiation is described at "SGP-330 GPS RECEIVER Electromagnetic Emission—FCC MEASUREMENT REPORT," Samyung Inc., available at: http://www.samyungenc.com/servlet/DownloadServlet?file_name=af0b328d-e01a-4b4e-965f-8431d23d40a9.pdf&file_name_origin=FCC-SGP-330.pdf A GPS receiver emits radio frequency signals at levels near 40 dBµV/m. This power is equivalent to −45 dBµV/m from a distance of three meters and −105 dBµV/m from a distance of one kilometer. This level of power can be detected by a superheterodyne receiver. The signal frequencies indicated in the article indicate the emission of harmonics of a 16 MHz crystal.

The waveforms at the multiple measured frequencies may be analyzed by a machine learning system or by other systems to identify recurring patterns, and the most consistent patterns may be denoted as identifying characteristics. Graph 150 indicates a sample of such an identifying characteristic, where a carrier frequency is modulated by a modulating frequency.

At a subsequent step 106, a radio receiver of a Defense Control Unit (DCU) is configured to receive radio signals at the frequencies noted as including identifying characteristics. The sensitivity of the radio receiver is configured to measure radiation at the diminished dBµtV/m level required for detected intruding vehicles in a larger restricted area, such as 1 km or more. The frequency range of the radio receiver may be set to a wide range according to the results determined at step 104. For example, a wideband radio receiver may be configured for receiving frequencies of 30 to 1600 MHz.

In some embodiments, an antenna of the radio receiver is configured as four separate antennas, oriented in four perpendicular directions to provide a directional indication of incoming signals. Multiple antennas may be used to provide more precise coordinates of an incoming vehicle, for example by triangulation of results. The radio receiver may include a field programmable gate array (FPGA), programmed to make multiple measurements, to facilitate calculation of multiple locations of an incoming vehicle, thereby also allowing calculation of incoming vehicle speed.

After configuration, the DCU may be operated to protect a restricted area at a step 108. If an incoming vehicle, such as a UAV is detected, then, at a step 110, then the DCU may be configured to issue a warning alert to a defense system, such as a counter-drone system. The alert may include parameters such as vehicle position and speed.

The DCU may also identify multiple drones having similar or different identifying characteristics.

Figure 2:
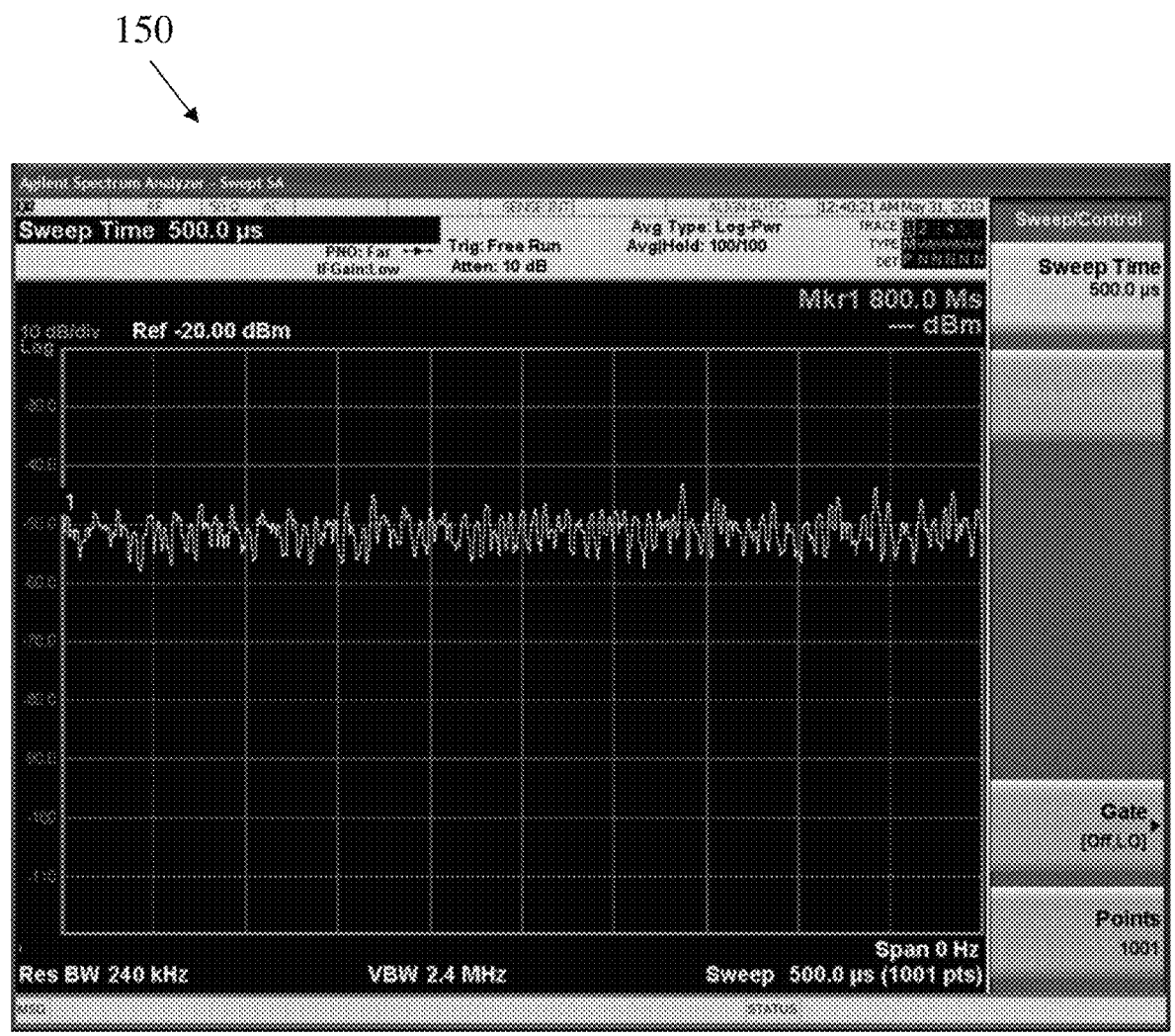
FIG. 2 is a graph of a filtered electromagnetic signal, by a system for detecting vehicles, according to some embodiments of the present invention.
Figure 3:
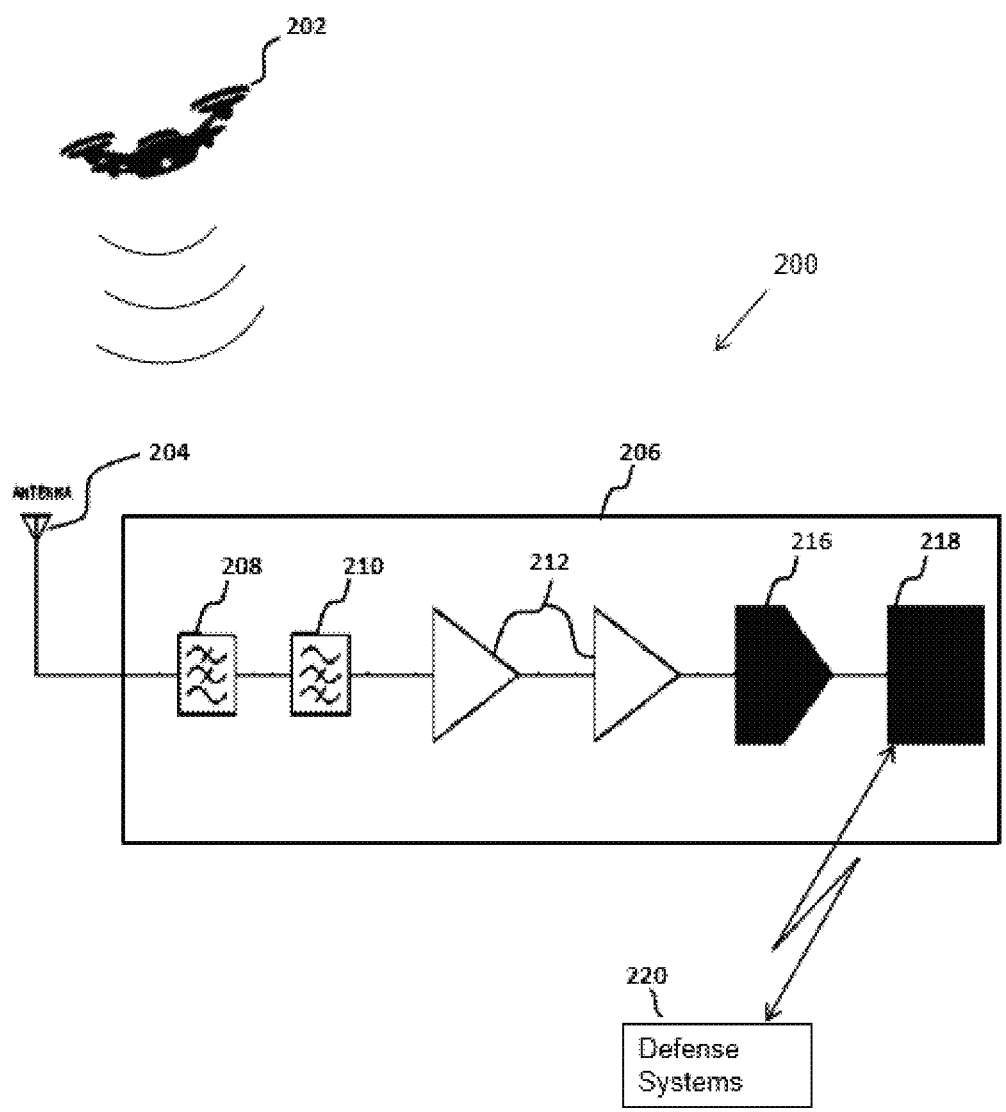
FIG. 3 is a schematic diagram of a system for detecting vehicles, according to some embodiments of the present invention.

FIG. 2 is a schematic diagram, depicting components of a system 200 for detecting incoming vehicles, according to some embodiments of the present invention. In an area in which there are legitimate drone activities, such as a business site receiving drone shipments or dispatching drone deliveries, system 200 may also be configured to protect the area against illegitimate drones.

System 200 includes one or more antennas 204, which sense electromagnetic radiation emissions from an intruding vehicle, such as a drone 204. Electrical signals provided by the antennas 204 may then be processed by several cascaded filters, such as the following: a low-pass filter 208, a band-pass filter 210, and one or more broadband amplifiers 212 (such as LEE 39+ amplifiers). Filter output is then sampled by an analog-to-digital converter (ADC) 216, and then processed to detect identifying characteristics by a processor, such as a field programmable gate array 218.

As described above, if identifying characteristics of an incoming vehicle are detected, security alerts may be generated by the FPGA 218 and transmitted to a vehicle defense system 220. The defense system may provide enemy vehicle interception mechanisms, such as net launchers, radio jammers, anti-drone drones, and/or lasers. The defense system may also perform alternative or additional functions, such as issuing alarms to human operators and notifying external security forces. The DCU may continue to send data to the defense system to permit on-going tracking of an incoming vehicle.

Processing of signals may also include processing multiple received data streams from multiple antennas, for example in order to triangulate a position of a UV (particularly UAV's). Processing may include processing streams to determine additional features of a UV incoming path, such as determining a position and speed of a drone, or identification of multiple incoming UVs in a pack.

It is to be understood that all or part of a process and of a system implementing the process of the present invention may be implemented in digital electronic circuitry, or in computer hardware, firmware, software, or in combinations thereof. All or part of the process and system may be implemented as a computer program product, tangibly embodied in an information carrier, such as a machine-readable storage device or in a propagated signal, for execution by, or to control the operation of, data processing apparatus, such as a programmable processor, computer, or deployed to be executed on multiple computers at one website or distributed across multiple websites. Memory storage may also include multiple distributed memory units, including one or more types of storage media. Examples of storage media include, but are not limited to, magnetic media, optical media, and integrated circuits. A computer configured to implement the process may access, provide, transmit, receive, and modify information over wired or wireless networks. The computing may have one or more processors and one or more network interface modules. Processors may be configured as a multi-processing or distributed processing system. Network interface modules may control the sending and receiving of data packets over networks.

It is to be further understood that the scope of the present invention includes variations and modifications thereof which would occur to persons skilled in the art upon reading the foregoing description and which are not disclosed in the prior art.

The invention claimed is:

1. A method for detecting an intruding vehicle entering a restricted area, the method comprising:
operating a first vehicle and measuring, at a test range, multiple frequencies of electromagnetic radiation emitted from the first vehicle;
determining, from the multiple measured frequencies of electromagnetic radiation, one or more identifying electromagnetic radiation characteristics, wherein the one or more identifying electromagnetic radiation characteristics include one or more modulation frequencies of one or more electromagnetic carrier frequencies, detected at a test range power level; and
configuring a radio receiver to detect the one or more identifying electromagnetic radiation characteristics of electromagnetic radiation emitted by a second vehicle at a detection range, by detecting the second vehicle electromagnetic radiation at a diminished power level reduced from the test range power level by a factor proportional to the ratio of the test range to the detection range.

2. The method of claim 1, wherein operating the first vehicle comprises operating the first vehicle in a closed environment, wherein insulation of the closed environment reduces electromagnetic radiation in a range of 30 MHz to 1.6 GHz and wherein the multiple measured frequencies of electromagnetic radiation are in the range of 30 MHz to 1.6 GHz.

3. The method of claim 1, wherein the first and second vehicles are unmanned aerial vehicles (UAVs).

4. The method of claim 1, wherein the first and second vehicles are unmanned aerial vehicles (UAVs) and wherein the detection range is an air space perimeter of the restricted area.

5. The method of claim 1, further comprising issuing an electronic or audio security alert in response to detecting the one or more identifying electromagnetic radiation characteristics emitted by the second vehicle.

6. The method of claim 1, wherein detecting the second vehicle further comprises determining at least one of a speed and a position of the second vehicle.

7. The method of claim 1, wherein detecting the second vehicle comprises triangulating the position of the second vehicle.

8. The method of claim 1, wherein operating the first vehicle comprises operating the first vehicle in a closed environment insulated to reduce external electromagnetic radiation.

9. A method for detecting an intruding vehicle entering a restricted area, the method comprising:
operating a first vehicle and measuring multiple frequencies of electromagnetic radiation emitted from the first vehicle;
determining, from the multiple measured frequencies of the electromagnetic radiation, one or more identifying electromagnetic radiation characteristics, wherein the one or more identifying electromagnetic radiation characteristics include one or more modulation frequencies of one or more electromagnetic carrier frequencies; and
configuring a radio receiver to detect the one or more identifying electromagnetic radiation characteristics of electromagnetic radiation emitted by a second vehicle at a detection range,
wherein the radio receiver comprises a multi-stage filter comprising a low-pass filter, a high pass filter, a 30 to 1600 MHz amplifier and an analog-to-digital (A-to-D) converter and a processor.

10. A system for detecting intruding vehicles in a restricted area comprising:
a radio antenna configured to receive electromagnetic radiation; and
a radio receiver including the radio antenna and a computer processor with an associated memory storage comprising instructions that when executed by the computer processor implement steps of:
receiving, by the radio antenna, multiple frequencies of electromagnetic radiation emitted from a first vehicle at a test range and measuring the multiple frequencies of the electromagnetic radiation emitted from the first vehicle;
determining, from the multiple measured frequencies of the electromagnetic radiation, one or more identifying electromagnetic radiation characteristics of the first vehicle including one or more modulation frequencies of one or more electromagnetic carrier frequencies, detected at a test range power level;
detecting the one or more identifying electromagnetic radiation characteristics in electromagnetic radiation received by the radio antenna and emitted by a second vehicle at a detection range, wherein the radio receiver is configured to detect the second vehicle electromagnetic radiation at a diminished power level reduced from the test range power level by a factor proportional to the ratio of the test range to the detection range; and responsively issuing an alert to a defense system.

* * * * *